(12) United States Patent  (10) Patent No.: US 8,279,617 B2
Choi et al.  (45) Date of Patent: Oct. 2, 2012

(54) PAD LAYOUT STRUCTURE OF DRIVER IC CHIP

(75) Inventors: Joung Cheul Choi, Daejeon-si (KR); Joon Ho Na, Daejeon-si (KR); Dae Seong Kim, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 0 days.

(21) Appl. No.: 12/883,555

(22) Filed: Sep. 16, 2010

(65) Prior Publication Data

US 2011/0075390 A1  Mar. 31, 2011

(30) Foreign Application Priority Data

Sep. 25, 2009 (KR) .................. 10-2009-0090771

(51) Int. Cl.
*H05K 7/10* (2006.01)
*H05K 7/12* (2006.01)

(52) U.S. Cl. ........ 361/767; 361/764; 361/787; 361/808; 174/557

(58) Field of Classification Search .................. 361/767, 361/783, 777, 764, 808; 174/557
See application file for complete search history.

(56) References Cited

U.S. PATENT DOCUMENTS

| 5,343,074 | A * | 8/1994 | Higgins et al. ................ 257/668 |
| 6,410,990 | B2 * | 6/2002 | Taylor et al. .................. 257/786 |
| 6,583,365 | B2 * | 6/2003 | Chang .......................... 174/260 |
| 7,514,959 | B2 * | 4/2009 | Or-Bach et al. ................ 326/39 |
| 7,800,913 | B2 * | 9/2010 | Torii et al. ..................... 361/749 |

FOREIGN PATENT DOCUMENTS

| JP | 08-191071 A | 7/1996 |
| JP | 11-133378 A | 5/1999 |
| JP | 2006-319338 A | 11/2006 |
| JP | 2009-059956 A | 3/2009 |
| WO | 2008/075838 A1 | 6/2008 |

* cited by examiner

*Primary Examiner* — Yuriy Semenenko
*Assistant Examiner* — Andargie M Aychillhum
(74) *Attorney, Agent, or Firm* — Kile Park Goekjian Reed & McManus PLLC

(57) ABSTRACT

A pad layout structure of a driver IC chip of a liquid crystal display device includes dummy power pads and dummy ground pads, which are disposed in corners of the driver IC chip and are connected to main power pads and main ground pads by metal lines in a chip-on-film (COF) package. Accordingly, it is possible to reduce the resistance of power supply lines and ground lines, to minimize a power dip of a block located far away from the main power pads and main ground pads, and to prevent a failure in power application, which may occur due to a decrease of adhesive strength at a specific position, by dispersing the adhesion positions of the power pads and ground pads.

6 Claims, 2 Drawing Sheets

PAD LAYOUT STRUCTURE OF DRIVER IC CHIP

BACKGROUND OF THE INVENTION

1. Field of the Invention

The present invention relates to a pad layout structure of a driver IC chip of a liquid crystal display device, and more particularly, to a pad layout structure of a driver IC chip in which dummy power pads and dummy ground pads are disposed in corners of a driver IC chip, and are connected to main power pads and main ground pads by metal lines in a chip-on-film (COF) package.

2. Description of the Related Art

A Liquid Crystal Display (LCD) is a device for displaying image data by allowing light to pass through the liquid crystal based on the characteristic of liquid crystal molecules, in which the arrangement thereof changes depending on an applied voltage. Among various LCDs, recently, a Thin Film Transistor (TFT) LCD formed using silicon IC fabrication technology has been the most actively used.

The TFT-LCD includes a liquid crystal panel and a driver IC for driving the liquid crystal panel. The liquid crystal panel includes a thin film transistor array substrate and a color filter substrate which are attached facing each other with a predetermined gap, and includes a liquid crystal layer injected into the space of the predetermined gap.

Generally, a driver IC chip of a large-sized LCD panel has a rectangular shape, in which the length in the horizontal direction is longer than the length in the vertical direction, due to the characteristics of an LCD application.

FIG. 1 is a view illustrating a pad layout structure of a conventional driver IC chip which is mounted in a chip-on-film (COF) scheme.

As shown in FIG. 1, a conventional driver IC chip 100 mounted in the COF scheme includes an internal circuit 110 disposed at the center of the driver IC chip; an input pad part 120 disposed on an outer upper side of the internal circuit 110; and an output pad part 130 disposed on a lower side, left and right sides, and both corners of the upper side. In addition, the driver IC chip 100 includes power supply lines and power pads 121a to 124a and 121b to 124b disposed thereon.

As described above, in the conventional driver IC chip 100 mounted in the COF scheme, power supply pads and ground pads are located only in the input pad part 120, which is one side of the chip, and there is no metal line for connecting a power supply pad and a ground pad in a COF package.

As described above, in the conventional driver IC chip mounted in the COF scheme, the output pad part in the lower long-axis direction and the output pad parts of the left and right sides have a difficulty in applying entirely uniform power due to an increase in the resistance of power supply lines. Also, when metal is additionally applied to the chip in order to solve such a defect, it increases the price thereof.

Meanwhile, in the conventional driver IC chip mounted in the COF scheme, there is no part which can function to radiate heat generated in the driver IC chip.

Recently, as the size of the panel has been enlarged, the operating frequency and panel load have increased, so that current consumption of the driver IC chip has increased. Therefore, when there is no proper heat-radiating means, the operating temperature of the chip increases, so that the properties of the driver IC chip may be deteriorated.

SUMMARY OF THE INVENTION

Accordingly, the present invention has been made in an effort to solve the problems occurring in the related art, and an object of the present invention is to provide a pad layout structure of a driver IC chip of a liquid crystal display device, in which dummy power pads and dummy ground pads are disposed in corners of a driver IC chip, and are connected to main power pads and main ground pads by metal lines in a chip-on-film (COF) package, thereby reducing the resistance of power supply lines and ground lines, and making it possible to radiate heat generated in the chip.

In order to achieve the above object, according to one aspect of the present invention, there is provided a pad layout structure of a driver IC chip mounted on a liquid crystal display (LCD) panel, the pad layout structure including: main power pads configured to supply at least one power supply voltage VDD to the driver IC chip; main ground pads configured to supply at least one ground voltage VSS to the driver IC chip; dummy power pads formed in four corner portions of the driver IC chip; and dummy ground pads formed in four corner portions of the driver IC chip, wherein the dummy power pads are connected to the main power pads by metal lines, and the dummy ground pads are connected to the main ground pads by metal lines.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
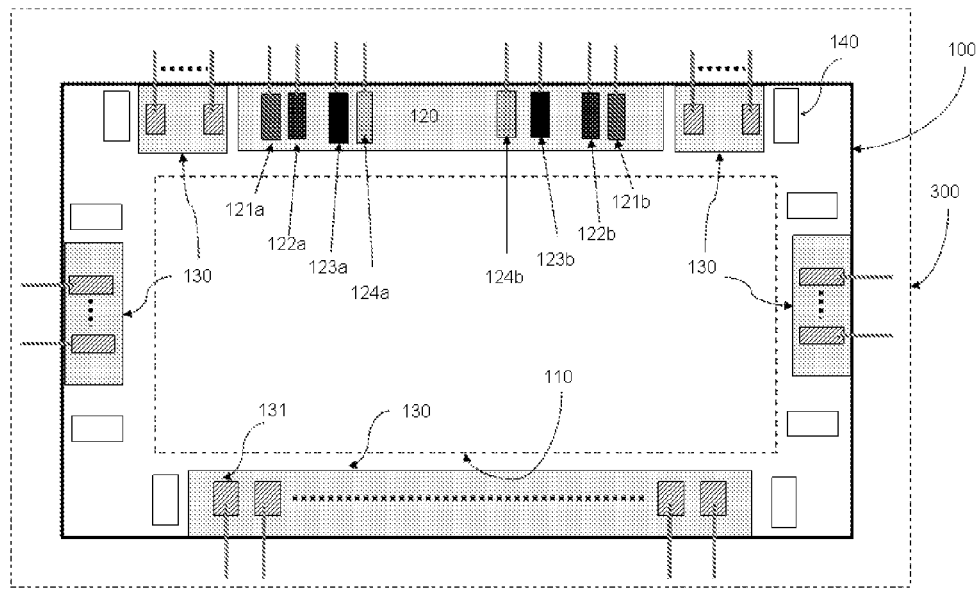
FIG. 1 is a view illustrating a pad layout structure of a conventional driver IC chip which is mounted in a chip-on-film (COF) scheme.

The main idea of the present invention is to provide a pad layout structure of a driver IC chip, in which dummy power pads and dummy ground pads are disposed on corners of a driver IC chip, and are connected to main power pads and main ground pads, respectively, through metal lines.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
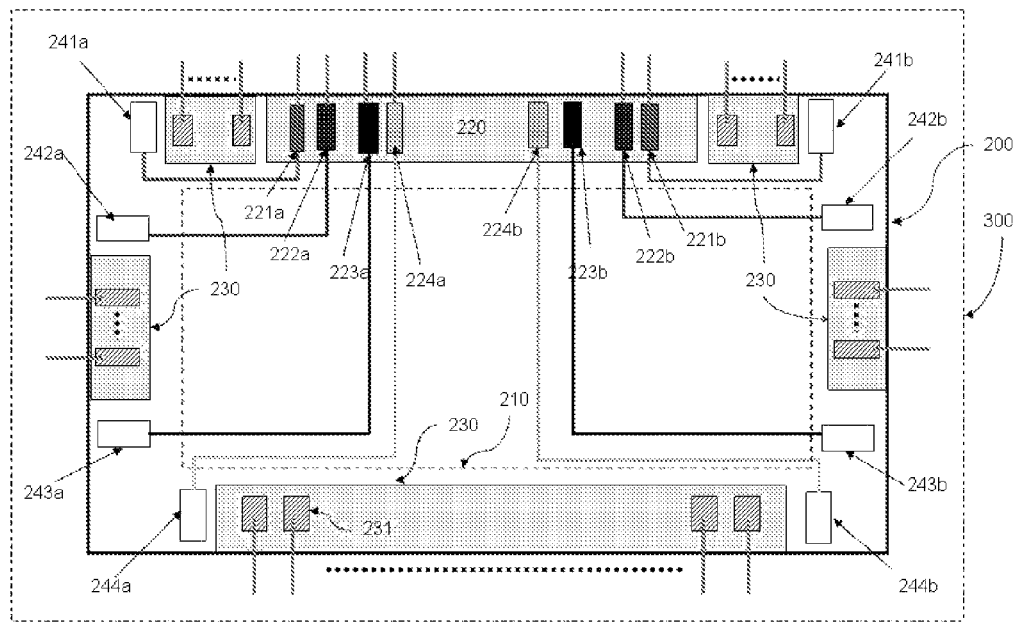
FIG. 2 is a view illustrating a pad layout structure of a driver IC chip according to an embodiment of the present invention.

FIG. 2 is a view illustrating a pad layout structure of a driver IC chip according to an embodiment of the present invention.

Referring to FIG. 2, a driver IC chip 200 according to an embodiment of the present invention includes an internal circuit 210 disposed at the center of the driver IC chip 200; an input pad part 220 disposed on an outer upper side of the internal circuit 210; and an output pad part 230 disposed on a lower side, left and right sides, and corners of the upper side.

Differently from the conventional driver IC chip 100 in which power pads and ground pads are disposed only in the input pad part of the driver IC chip, or in which only floating dummy pads 140 exist in four corners of the driver IC chip, the driver IC chip 200 according to an embodiment of the present invention additionally includes dummy power pads 241a, 241b, 244a, and 244b, and dummy ground pads 242a, 242b, 243a, and 243b in four corners of the driver IC chip.

According to an embodiment of the present invention, the driver IC chip 200 includes main power pads 221a, 221b, 224a, and 224b; main ground pads 222a, 222b, 223a, and 223b; the dummy power pads 241a, 241b, 244a, and 244b; the and dummy ground pads 242a, 242b, 243a, and 243b.

The main power pads 221a, 221b, 224a, and 224b supply at least one power supply voltage VDD to the driver IC chip 200 through power supply lines.

Specifically, the main power pads include first main power pads 221a and 221b for supplying a first power supply voltage VDD1 to the driver IC chip 200, and second main power pads 224a and 224b for supplying a second power supply voltage VDD2 to the driver IC chip 200.

The main ground pads 222a, 222b, 223a, and 223b supply at least one ground voltage VSS to the driver IC chip 200 through power supply lines.

Specifically, the main ground pads include first main ground pads 222a and 222b for supplying a first ground voltage VSS1 to the driver IC chip 200, and second main ground pads 223a and 223b for supplying a second ground voltage VSS2 to the driver IC chip 200.

The dummy power pads 241a, 241b, 244a, and 244b, and the dummy ground pads 242a, 242b, 243a, and 243b are formed in four corners of the driver IC chip 200.

The dummy power pads include first dummy power pads 241a and 241b connected to the first main power pads 221a and 221b by means of metal lines, and second dummy power pads 244a and 244b connected to the second main power pads 224a and 224b by means of metal lines.

In this case, the first dummy power pads 241a and 241b are connected to the first main power pads 221a and 221b located nearest to the first dummy power pads 241a and 241b, respectively, by means of metal lines; and the second dummy power pads 244a and 244b are connected to the second main power pads 224a and 224b located nearest to the first dummy power pads 244a and 244b, respectively, by means of metal lines.

The dummy ground pads include first dummy ground pads 242a and 242b connected to the first main ground pads 222a and 222b by means of metal lines, and second dummy ground pads 243a and 243b connected to the second main ground pads 223a and 223b by means of metal lines.

In this case, the first dummy ground pads 242a and 242b are connected to the first main ground pads 222a and 222b located nearest to the first dummy ground pads 242a and 242b, respectively, by means of metal lines; and the second dummy ground pads 243a and 243b are connected to the second main ground pads 223a and 223b located nearest to the first dummy ground pads 243a and 243b, respectively, by means of metal lines.

Figure 3:
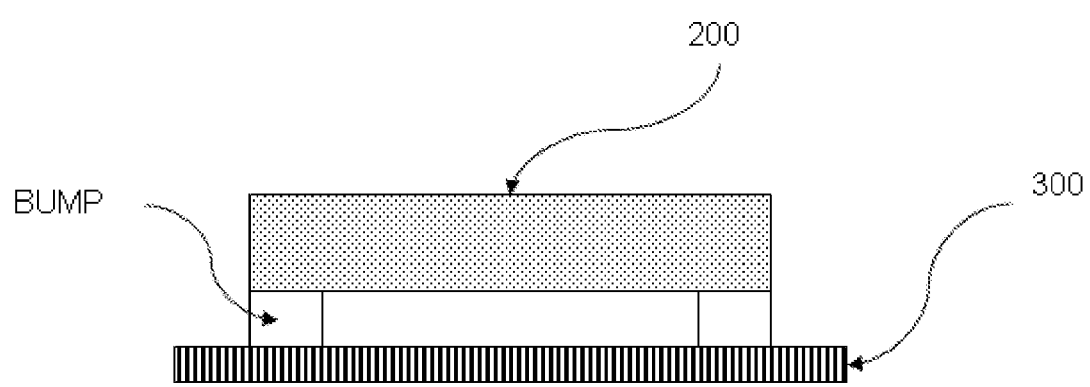
FIG. 3 is a view illustrating a structure in which a driver IC chip according to an embodiment of the present invention is mounted on a COF film.

FIG. 3 is a view illustrating a structure in which a driver IC chip according to an embodiment of the present invention is mounted on a COF film.

As shown in FIG. 3, the driver IC chip 200 according to an embodiment of the present invention is mounted on a COF film 300 of an LCD panel in a COF scheme.

According to an embodiment of the present invention, the dummy power pads 241a, 241b, 244a, and 244b, and the dummy ground pads 242a, 242b, 243a, and 243b are disposed in corners of the driver IC chip 200, and are connected to the main power pads 221a, 221b, 224a, and 224b and the main ground pads 222a, 222b, 223a, and 223b through metal lines, so that it is possible to reduce the resistance of the power supply lines and ground lines.

Accordingly, it is possible to minimize a power dip, which causes a drop in the power supply voltage of a block located far away from the main power pads and main ground pads. In addition, since the adhesion positions of the power pads and ground pads are dispersed, it is possible to prevent a failure in power application, which may be caused by a decrease of adhesive strength at a specific position.

Meanwhile, the metal lines in a COF package are formed to have wide or narrow widths, so that it is possible to efficiently control and radiate heat generated in the driver IC chip, without a separate radiator.

It goes without saying that the numbers and positions of dummy power pads and dummy ground pads disposed in the driver IC chip according to an embodiment of the present invention may vary depending on the types of the main power pads and main ground pads, and the layout of the driver IC chip.

In addition, depending on the layout of the dummy power pads and dummy ground pads in the driver IC chip, the connection manner between power pads and the connection manner between ground pads in a COF package may vary.

As is apparent from the above description, the present invention provides a pad layout structure of a driver IC chip, in which dummy power pads and dummy ground pads are disposed in corners of the driver IC chip, and are connected to main power pads and main ground pads through metal lines, so that it is possible to reduce the resistance of power supply lines and ground lines.

Accordingly, it is possible to minimize a power dip, which causes a drop in the power supply voltage of a block located far away from the main power pads and main ground pads. Also, by dispersing the adhesion positions of the power pads and ground pads, it is possible to prevent a failure in power application, which may be caused by a decrease of adhesive strength at a specific position.

Meanwhile, when the metal lines in a COF package are formed to have a wide width, it is possible to efficiently control and radiate heat generated in the driver IC chip, without a separate radiator.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A pad layout structure of a driver IC chip mounted on a liquid crystal display (LCD) panel in a chip-on-film (COF) scheme for supplying uniform power to the driver IC chip, the pad layout structure comprising:

first main power pads configured to supply a first power supply voltage VDD1 to the driver IC chip;

second main power pads configured to supply a second power supply voltage VDD2 to the driver IC chip;

first main ground pads configured to supply a first ground voltage VSS1 to the driver IC chip;

second main ground pads configured to supply a second ground voltage VSS2 to the driver IC chip;

first dummy power pads connected to the first main power pads by metal lines, the first main power pads supplying the first power supply voltage VDD1 to the first dummy power pads;

second dummy power pads connected to the second main power pads by metal lines, the second main power pads supplying the second power supply voltage VDD2 to the second dummy power pads;

first dummy ground pads connected to the first main ground pads by metal lines, the first main ground pads supplying the first ground voltage VSS1 to the first dummy ground pads; and second dummy ground pads connected to the second main ground pads by metal lines, the second main ground pads supplying the second ground voltage VSS2 to the second dummy ground pads.

2. The pad layout structure according to claim 1, wherein the first dummy power pads are connected to the first main power pads located nearest to the first dummy power pads, respectively, by means of metal lines.

3. The pad layout structure according to claim 1, wherein the second dummy power pads are connected to the second main power pads located nearest to the second dummy power pads, respectively, by means of metal lines.

4. The pad layout structure according to claim 1, wherein the first dummy ground pads are connected to the first main ground pads located nearest to the first dummy ground pads, respectively, by means of metal lines.

5. The pad layout structure according to claim 1, wherein the second dummy ground pads are connected to the second main ground pads located nearest to the second dummy ground pads, respectively, by means of metal lines.

6. The pad layout structure according to claim 1, wherein widths of the metal lines are variable.

* * * * *